United States Patent [19]
Liu et al.

[11] Patent Number: 6,040,223
[45] Date of Patent: Mar. 21, 2000

[54] METHOD FOR MAKING IMPROVED POLYSILICON FET GATE ELECTRODES HAVING COMPOSITE SIDEWALL SPACERS USING A TRAPEZOIDAL-SHAPED INSULATING LAYER FOR MORE RELIABLE INTEGRATED CIRCUITS

[75] Inventors: Meng-Chang Liu, Chia-yi; Jyh-Feng Lin, Hua-Lien; Ming-Shu Yen, Hsin-Chu; Su-Ying Su, Taipei; Fu-Ying Chiu, YuLin; Chien-Hung Lin, Hsin-Chu, all of Taiwan

[73] Assignee: Taiwan Semiconductor Manufacturing Company, Hsin-Chu, Taiwan

[21] Appl. No.: 09/373,636

[22] Filed: Aug. 13, 1999

[51] Int. Cl.7 .................................................. H01L 21/336
[52] U.S. Cl. ........................... 438/303; 438/305; 438/595
[58] Field of Search ..................... 438/286, 301, 438/303, 305, 306, 307, 521, 585, 586, 595

[56] References Cited

U.S. PATENT DOCUMENTS

| | | | |
|---|---|---|---|
| 5,405,791 | 4/1995 | Ahmad et al. | 437/34 |
| 5,656,533 | 8/1997 | Kim | 438/396 |
| 5,747,373 | 5/1998 | Yu | 438/305 |
| 5,824,588 | 10/1998 | Liu | 438/302 |

*Primary Examiner*—Charles Bowers
*Assistant Examiner*—Jack Chen
*Attorney, Agent, or Firm*—George O. Saile; Stephen B. Ackerman

[57] ABSTRACT

A method for making improved polysilicon FET gate electrodes having composite sidewall spacers is achieved. After forming the polysilicon gate electrodes on the substrate, a $SiO_2$ stress-release layer is deposited having a trapezoidal shape. A $Si_3N_4$ layer is deposited and plasma etched back using the $SiO_2$ layer as an etch-endpoint-detect layer to form composite sidewall spacers that include portions of the trapezoidal-shaped oxide layer. The $SiO_2$ layer protects the source/drain areas from plasma etch damage that could cause high leakage currents. The $Si_3N_4$ also extends over the $SiO_2$ layer at the upper edges of the polysilicon gate electrodes. This prevents erosion of the $SiO_2$ along the gate electrodes when the remaining oxide is removed from the source/drain areas using hydrofluoric acid wet etching. When an insulating layer is deposited over the FETs, and self-aligned contact openings are etched to the source/drain areas and extending over the gate electrodes, the $Si_3N_4$ extending over the portion of the trapezoidal-shaped $SiO_2$ layer that forms part of the composite sidewall spacer protects the $SiO_2$ from etching. This results in more reliable contacts without degrading the FET performance.

20 Claims, 2 Drawing Sheets

METHOD FOR MAKING IMPROVED POLYSILICON FET GATE ELECTRODES HAVING COMPOSITE SIDEWALL SPACERS USING A TRAPEZOIDAL-SHAPED INSULATING LAYER FOR MORE RELIABLE INTEGRATED CIRCUITS

BACKGROUND OF THE INVENTION (1). Field of the Invention

The present invention relates to the fabrication of integrated circuit devices on semiconductor substrates, and more particularly relates to a method for making more reliable field effect transistors (FETs) having less leakage current. The method utilizes a composite sidewall spacer consisting of a trapezoidal-shaped silicon oxide ($SiO_2$) spacer and a silicon nitride ($Si_3N_4$) spacer that reduces substrate damage in the source/drain contact areas during plasma etching.

(2). Description of the Prior Art

One type of semiconductor device commonly used for Ultra Large Scale Integration (ULSI) is the Field Effect Transistor (FET). These FETs are preferred because of their small size, high packing density, low power consumption, high yields, and low manufacturing cost. FET devices are fabricated on single-crystal silicon substrates by forming a thin gate oxide, depositing a polysilicon or polycide layer and patterning to form gate electrodes. Then self-aligned source/drain contact (SAC) areas are formed in the substrate adjacent to the gate electrodes. For narrow channel FETs, to eliminate undesirable short-channel effects, it is common practice to include lightly doped source/drain areas and sidewall spacers before forming the self-aligned heavily doped source/drain contact areas. The gate electrodes are themselves used as implant barrier masks to form the self-aligned lightly doped source/drain areas, commonly referred to as the LDD areas.

Unfortunately, several problems arise during processing that degrade the FET device. One of the problems that arises during directional plasma etching to form the sidewall spacers is that ion damage to the shallow diffused source/drain areas results in higher leakage currents when the device is powered up. The sidewall spacers are typically formed by anisotropically etching back a $Si_3N_4$. However, it is necessary to use a thin $SiO_2$ layer (a stress-release layer) to minimize the stress between the $Si_3N_4$ and the silicon substrate. When this $SiO_2$ layer is removed from the source/drain areas by wet etching, the $SiO_2$ can be eroded along the sidewalls of the gate electrodes which degrades device performance and reliability.

A method for making a patterned second polysilicon layer over a patterned first polysilicon layer (such as a gate electrode) without leaving residue (stringers) that would otherwise occur during directional plasma etching is described in U.S. Pat. No. 5,656,533 to Kim. Kim's patent does not address the above problem. Ahmad et al. in U.S. Pat. No. 5,405,791 teach a method for making N-channel and P-channel FETs using disposable sidewall spacers and using a $Si_3N_4$ cap layer over the FETs, but do not address the above problems. In U.S. Pat. No. 5,824,588 to Liu, a method is described for making a double-sidewall salicide MOS device. The method uses a first sidewall spacer that is higher than the gate electrode to prevent short circuiting between the gates and the source/drain areas. The second sidewall spacer is used to form the LDD regions. Yu in U.S. Pat. No. 5,747,373 teaches a method for making a salicide FET using a double-sidewall spacer to prevent thinning of the first spacer during precleaning of the substrate surface, and thereby eliminate electrical shorting between the gate electrodes and the source/drain areas when a metal is deposited and annealed to form the salicide FET.

Therefore, there is still a strong need in the semiconductor industry to fabricate more reliable FETs using a process that minimizes or eliminates plasma damage to the source/drain contacts, and prevents erosion of the thin $SiO_2$ stress-release layer along the gate electrodes when a wet etch is used to remove the stress-release layer on the source/drain contact areas.

SUMMARY OF THE INVENTION

A principal object of this invention is to provide a method for making FET gate electrodes having lower leakage current by reducing the substrate damage in the source/drain areas caused by plasma etching to form gate-electrode sidewall spacers.

Another object of this invention is to reduce the substrate damage by using a composite sidewall spacer that includes a trapezoidal-shaped $SiO_2$ layer under a $Si_3N_4$ sidewall spacer.

Still another object of this invention is to utilize this composite sidewall spacer with the trapezoidal-shaped $SiO_2$ layer for etching contact openings to the source/drain areas that also overlap the polysilicon gate electrodes. The trapezoidal-shaped $SiO_2$ results in the $Si_3N_4$ sidewall layer being contiguous with the top edge of the polysilicon gate thereby preventing overetching of the $SiO_2$ layer on the sidewall of the polysilicon gate electrode when contact openings, which extend over the gate electrode, are etched in an insulating layer to the source/drain contacts.

In summary, the objectives of this invention for making more reliable FETs using a trapezoidal-shaped $SiO_2$ layer for making the sidewall spacers on the gate electrodes are achieved by providing a silicon semiconductor substrate having device areas surrounded and electrically isolated by field oxide areas or shallow trench isolation. A gate oxide is formed on the device areas. A polysilicon layer, which is doped either in situ or by ion implantation, is deposited on the substrate and patterned to form FET gate electrodes over the device areas. Lightly doped source/drain areas are formed adjacent to the FET gate electrodes by ion implantation. By the method of this invention, a $SiO_2$ first insulating layer, having a trapezoidal shape, is formed on the gate electrodes, leaving the top edges of the gate electrodes essentially free of the $SiO_2$ layer. The first insulating layer can be deposited by high-density plasma (HDP) chemical vapor deposition (CVD), while concurrently DC biasing the substrate during $SiO_2$ deposition to achieve an etch-rate-to-deposition-rate ratio equal to about 1 at the edges of the polysilicon gate electrodes. Alternatively, a conformal CVD $SiO_2$ can be deposited and then sputter etched back in an inert gas to achieve the same trapezoidal shape. Next, a conformal $Si_3N_4$ second insulating layer is deposited on the trapezoidal-shaped first insulating layer. The first insulating layer also serves as a stress-release layer for the $Si_3N_4$ layer. The $Si_3N_4$ is then anisotropically plasma etched back to the first insulating layer to form sidewall spacers on the sidewalls of the gate electrodes. The $SiO_2$ first insulating layer acts as an etch endpoint-detect layer and also serves as a buffer layer to minimize substrate damage during the plasma etching and thereby reducing leakage currents. The remaining first insulating layer can now be removed from the lightly doped source/drain areas using a hydrofluoric acid wet etch, while the $Si_3N_4$ second insulating layer protects the SiO$_2$ first insulating layer from etching at top edges of the gate electrodes. Heavily doped source/drain contact areas are formed adjacent to the sidewalls, also by ion implantation, to complete the FETs. A blanket third insulating layer, such as SiO$_2$, is deposited on the substrate and is planarized, for example, by chemical/ mechanical polishing. Contact openings are then etched in the third insulating layer to the source/drain contact areas. The Si$_3$N$_4$ sidewall spacers serve as an etch-stop layer when etching the contact openings self-aligned to the gate electrodes. When the contact openings are etched extending over the polysilicon gate electrodes to provide electrical contact between the gate electrode and one of the source/drain contact areas, the Si$_3$N$_4$ second insulating layer protects the SiO$_2$ first insulating layer from etching at the top edges of the gate electrodes, that would otherwise degrade the device (FET) characteristics.

BRIEF DESCRIPTION OF THE DRAWINGS

The objects and other advantages of this invention are best understood by the preferred embodiment with reference to the attached drawings which are now briefly described.

DESCRIPTION OF THE PREFERRED EMBODIMENT

The present invention is now described in more detail for making these improved field effect transistors having these novel sidewall spacers using a trapezoidal-shaped insulating layer. Although the method is described for making an N-channel FET on a P-doped substrate, it should be understood by one skilled in the art that the method can be applied equally to the formation of P-channel FETs on N-doped substrates, and generally applies to making both P-channel and N-channel FETs using P- and N-doped wells on the same substrate thereby allowing for the fabrication of CMOS circuits.

Figure 1:
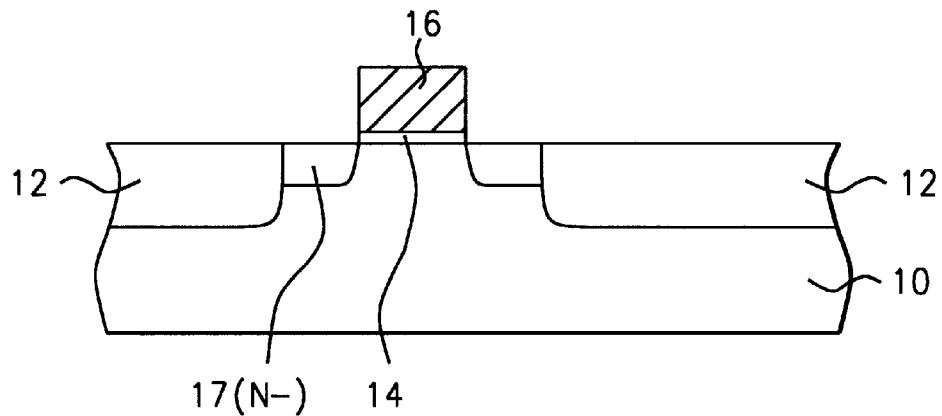
FIGS. 1 through 5 show a schematic cross-sectional views of an FET using a trapezoidal-shaped insulating layer for making more reliable sidewall spacers on the FET gate electrodes.

Referring now to FIG. 1, a portion of a semiconductor substrate 10 is shown having a partially completed FET. Preferably the substrate 10 is a P$^+$ doped single crystal silicon having, for example, a <100> crystallographic orientation. Field oxide areas 12 are formed surrounding and electrically isolating the FET device areas. Although the invention is not limited by the method of making the field isolation, shallow trench isolation (STI) is preferred over the more conventional LOCOS method for high-density integrated circuits. Briefly, the shallow trench isolation method involves etching a trench in the substrate 10, and filling with an insulator 12, such as a chemical-vapor-deposited (CVD) SiO$_2$ that is planarized to be coplanar with the substrate surface. Typically the STI oxide is between about 3000 and 6000 Angstroms thick.

Still referring to FIG. 1, a gate oxide 14 is grown on the surface of the device areas for the FET. The gate oxide is formed by thermal oxidation, for example, by subjecting the substrate to dry oxygen in an oxidation furnace. The gate oxide is grown to a preferred thickness of between about 40 and 100 Angstroms. Next, a polysilicon layer 16 is deposited on the substrate. Typically polysilicon layer 16 is deposited by low-pressure chemical vapor deposition (LPCVD) using, for example, silane (SiH$_4$) as the reactant gas, and is deposited to a thickness of between about 800 and 2000 Angstroms. Polysilicon layer 16 is then N$^+$ doped by ion implantation using, for example, either arsenic ions (As$^{75}$) or phosphorus ions (P$^{31}$). After implantation the preferred dopant concentration in layer 16 is between about 1.0 E 18 and 1.0 E 20 atoms/cm$^3$. Although the invention is depicted for an FET having polysilicon gate electrodes, the method also applies to FETs having polycide gate electrodes in which a refractory metal silicide, such as tungsten silicide, is deposited on the doped polysilicon layer 16.

The polysilicon layer 16 is then patterned using conventional lithographic techniques and anisotropic plasma etching to form gate electrodes, also labeled 16. Preferably layer 16 is patterned using a reactive ion etcher or a high-density-plasma (HDP) etcher in a gas mixture of such as Cl$_2$, O$_2$, and He that etches the polysilicon selectively to the underlying gate oxide 14.

Continuing with FIG. 1, lightly doped source/drain areas 17 (N$^-$) are formed in the device areas adjacent to the gate electrodes 16. Preferably the lightly doped drains are formed by ion implanting an N-type impurity, such as As$^{75}$ or P$^{31}$, to a concentration of between about 1.0 E 13 and 1.0 E 16 atoms/cm$^3$.

Figure 2:
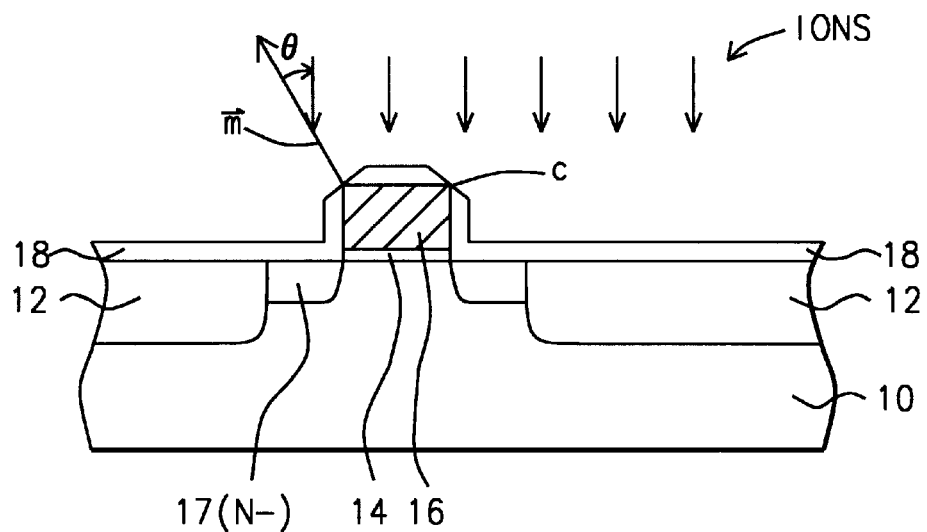

Referring to FIG. 2 and by the method of this invention, a first insulating layer 18 is deposited having a trapezoidal shape. Preferably layer 18 is SiO$_2$ and is deposited to a thickness of between about 100 and 500 Angstroms, and the SiO$_2$ is tapered (having an angle of about 45°) at the top edges C of the gate electrodes 16. This leaves the top edges C of the gate electrodes essentially free of the SiO$_2$ layer 18. This trapezoidal-shaped SiO$_2$ can be achieved by one of two methods. In one method, the SiO$_2$ is deposited using a high-density-plasma CVD tool, in which the substrate is DC biased by applying a negative voltage to the substrate. One way of providing a DC bias is to place the wafer (substrate) on an insulated electrode (in the tool) and applying an RF power (13.56 MHz) to the insulated electrode to provide a self-biasing effect. The DC bias results in directional ionic sputtering of the top surface of the substrate. Since the sputtering yield is an increasing function of the angle $\theta$ of ion incidence relative to the normal $\vec{n}$ of the substrate surface, the sputtering is enhanced at the corners C resulting in layer 18 having a trapezoidal shape, as shown in FIG. 2. The deposition parameter and sputtering parameters can be adjusted to achieve an etch-rate-to-deposition-rate ratio equal to about 1 at the edges of the polysilicon gate electrodes. This results in a sloped edge of about 45 to 60°. This slope can be achieved by depositing layer 18 using plasma-enhanced CVD with a gas mixture of SiH$_4$, O$_2$, and Ar, and at an RF power of between about 2000 and 2500 watts while providing a DC bias to the substrate by applying an RC power of between 100 and 200 watts. Another method of forming the trapezoidal-shaped oxide 18 is to deposit a conformal CVD SiO$_2$, and then to sputter etch back the SiO$_2$ in an inert gas. Preferably the SiO$_2$ layer 18 is deposited using LPCVD and a reactant gas such as tetraethosiloxane (TEOS). The substrate can then be etched back in a separate sputter etching tool. For example, the substrate can be etched in a reactive ion etcher using argon (Ar) as the etchant gas. Since the etch rate of this physical sputter etching is a function of incident angle of the sputtering ions (Ar), the etch rate of the SiO$_2$ at the corners C is faster and results in a trapezoidal-shaped oxide layer 18. The deposition thickness and the etchback conditions of layer 18 can be adjusted to achieve a thickness of between about 100 and 600 Angstroms on the horizontal and vertical surfaces of the gate electrodes 16, while the corner s C are essentially free of $SiO_2$ layer 18, as depicted in FIG. 2.

Figure 3:
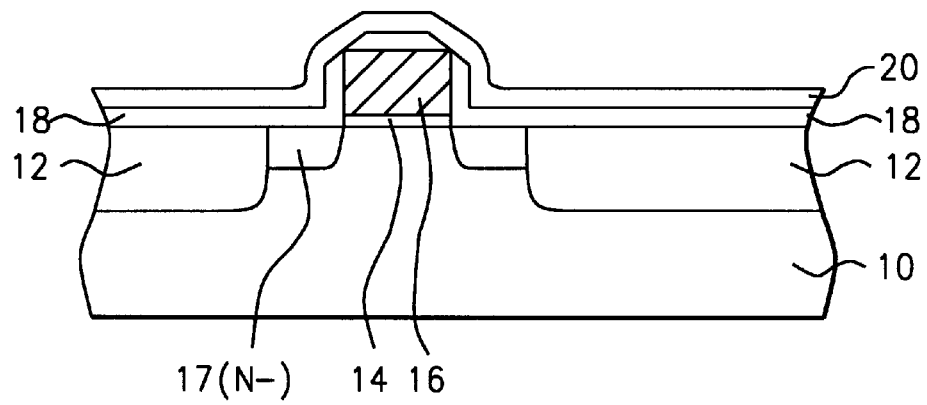

Referring to FIG. 3, a conformal $Si_3N_4$ second insulating layer 20 is deposited on the trapezoidal-shaped $SiO_2$ layer 18. Layer 18 serves as a stress-release layer under the $Si_3N_4$ layer. Layer 20 is deposited by LPCVD using, for example, dichlorosilane as the reactant gas. The $Si_3N_4$ second insulating layer 20 is deposited to a thickness of between about 300 and 3000 Angstroms.

Figure 4:
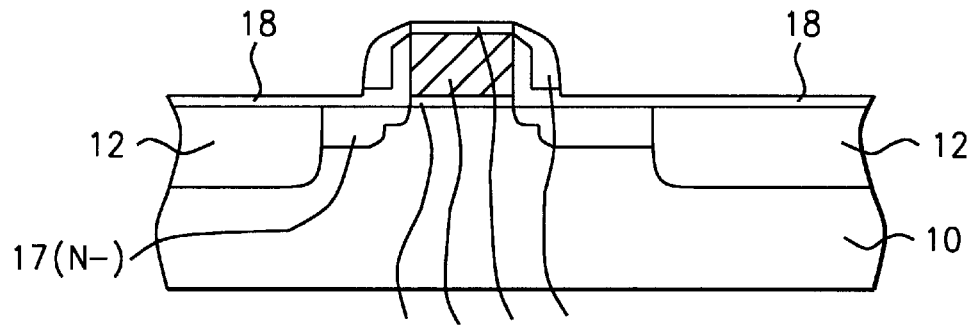

Referring to FIG. 4, the $Si_3N_4$ layer 20 is then anisotropically plasma etched back to the $SiO_2$ first insulating layer 18 to form sidewall spacers 22 on the sidewalls of the gate electrodes 16, using the $SiO_2$ first insulating layer 18 as an etch endpoint-detect layer. After the endpoint is reached, an oxide overetch is used to ensure that all the $Si_3N_4$ is removed across the wafer due to any nonuniformities during the $Si_3N_4$ deposition. This ensures that the oxide layer 18 can be reliably removed across the wafer at a later step. The anisotropic plasma etching of the $Si_3N_4$ 20 is carried out using a HDP etcher and an etchant gas mixture such as $CF_4$, $CHF_3$, $O_2$, $N_2$, CO, $C_4F_8$, and Ar that etches $Si_3N_4$ selectively to $SiO_2$ and having an etch-rate ratio at least greater than 5:1. The $SiO_2$ layer 18 also serves as a buffer layer to minimize substrate damage during the plasma etching and thereby reducing leakage currents. The remaining $SiO_2$ first insulating layer 18 is now removed from the lightly doped source/drain areas 17 ($N^-$) using a hydrofluoric (HF) acid wet etch. For example, the wet etch is a dilute solution of hydrofluoric acid and water having a ratio by volume of about 1:100. An important feature of this invention and by virtue of the trapezoidal-shaped $SiO_2$ layer 18, the upper portion of the $Si_3N_4$ sidewall spacers 22 protects the $SiO_2$ first insulating layer 18 from etching at top edges C of the gate electrodes 16 when the HF wet etch is carried out.

Still referring to FIG. 4, heavily doped source/drain contact areas 19 ($N^+$) are formed adjacent to and self-aligned to the sidewalls 22. The source/drain contact areas are formed by ion implanting $P^{31}$, and are annealed to activate the implanted species and to have a final concentration of between about 1.0 E 12 and 1.0 E 14 atoms/cm$^3$.

Figure 5:
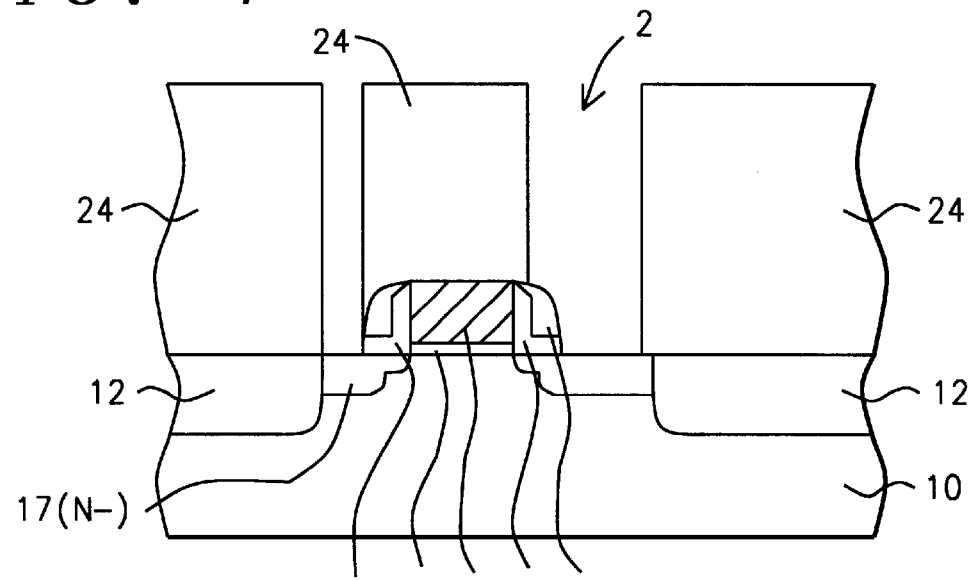

Referring to FIG. 5 and after completing the FETs, a blanket third insulating layer 24 is deposited on the substrate. Layer 24 is preferably $SiO_2$ deposited by LPCVD using a reactant gas such as TEOS. Alternatively, the third insulating layer 24 can be a doped glass such as borophosphosilicate glass (BPSG) and is also deposited by LPCVD using TEOS as the reactant gas, and is in-situ doped with boron and phosphorus. The insulating layer 24 is then planarized, for example, by chemical/mechanical polishing to a thickness of between about 6000 and 12000 Angstroms over the FETs.

Still referring to FIG. 5, conventional photolithographic techniques and anisotropic etching are used to selectively etch contact openings 2 in the third insulating layer 24 to the source/drain contact areas 19 ($N^+$) and to the $Si_3N_4$ sidewall spacers 22. The $Si_3N_4$ sidewall spacers 22 serve as an etch-stop layer when etching the contact openings 2 self-aligned to the gate electrodes 16. The contact openings 2 are preferably etched using HDP etching and an etchant gas such as $CF_4$, $CHF_3$, $O_2$, $N_2$, CO, $C_4F_8$, and Ar which has an etch-rate selectivity of $SiO_2$ to $Si_3N_4$ of at least greater than 10:1.

Figure 6:
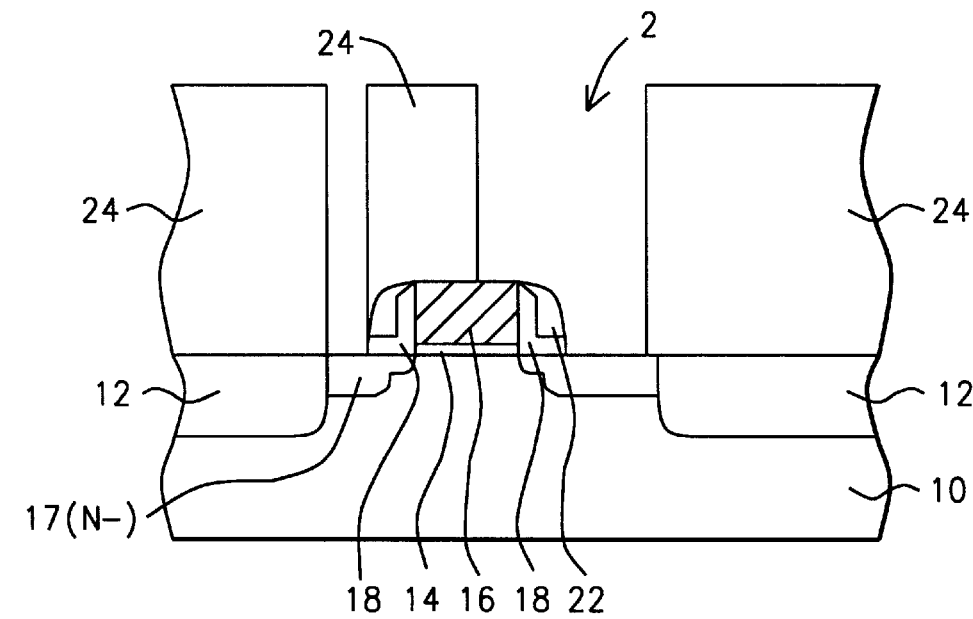
FIG. 6 is a schematic cross-sectional view depicting additional advantages of using these novel sidewall spacers when contact openings are etched extending over the FET gate electrodes.

Referring to FIG. 6, an important feature of this invention is that when the contact openings 2 are etched extending over the polysilicon gate electrodes 16, the $Si_3N_4$ sidewall spacers 22 extending over the trapezoidal $SiO_2$ layer 18 at the edge C protects the $SiO_2$ from etching that could otherwise degrade FET device characteristics. Contacts that overlap the gate electrode are commonly used when the integrated circuit requires electrical connections between the gate electrode and one of the source/drain areas.

While the invention has been particularly shown and described with reference to the preferred embodiment thereof, it will be understood by those skilled in the art that various changes in form and details may be made without departing from the spirit and scope of the invention.

What is claimed is:

1. A method for making FET gate electrodes having composite sidewall spacers using a trapezoidal-shaped insulating layer comprising the steps of:

providing a semiconductor substrate having device areas surrounded and electrically isolated by field oxide areas;

forming a gate oxide on said device areas;

depositing a polysilicon layer on said device areas and elsewhere on said substrate, said polysilicon layer being conductively doped;

patterning said polysilicon layer to form said FET gate electrodes on said device areas;

forming lightly doped source/drain areas adjacent to said FET gate electrodes;

depositing a first insulating layer on said FET gate electrodes, said first insulating layer having a trapezoidal shape over said FET gate electrodes such that only the top edges of said FET gate electrodes are free of said first insulating layer;

depositing a conformal second insulating layer on said first insulating layer;

anisotropically plasma etching said second insulating layer to said first insulating layer to form said sidewall spacers on sidewalls of said FET gate electrodes, said first insulating layer acting as an etch endpoint detect;

removing said first insulating layer remaining on said lightly doped source/drain areas using a wet etch, while said second insulating layer protects said first insulating layer at top edges of said FET gate electrodes;

forming source/drain contact areas adjacent to said sidewalls of said FET gate electrodes in said device areas;

depositing a blanket third insulating layer on said substrate and planarizing;

etching contact openings in said third insulating layer to said source/drain contact areas, while said second insulating layer protects said first insulating layer at top edges of said FET gate electrodes when etching said contact openings that extend over said FET gate electrodes.

2. The method of claim 1, wherein said gate oxide is formed by thermal oxidation to a thickness of between about 40 and 100 Angstroms.

3. The method of claim 1, wherein said polysilicon layer is deposited to a thickness of between about 800 and 2000 Angstroms and is conductively doped to a concentration of between about 1.0 E 18 and 1.0 E 20 atoms/cm$^3$.

4. The method of claim 1, wherein said first insulating layer is silicon oxide deposited by high-density plasma chemical vapor deposition to a thickness of between about 100 and 500 Angstroms on horizontal surfaces of said substrate, while concurrently DC biasing said substrate during deposition to achieve a silicon oxide etch rate to silicon oxide deposition rate having a ratio equal to about 1 at said top edges of said FET gate electrodes.

5. The method of claim 1, wherein said first insulating layer is silicon oxide deposited conformally by chemical vapor deposition and subsequently subjected to sputter etching in an inert gas to achieve a final thickness of between about 100 and 500 Angstroms on horizontal surfaces of said substrate, while said sputter etching results in enhanced etching at top edges of said FET gate electrodes thereby achieving said trapezoidal-shaped insulating layer.

6. The method of claim 1, wherein said second insulating layer is silicon nitride deposited to a thickness of between about 300 and 3000 Angstroms.

7. The method of claim 6, wherein said silicon nitride is anisotropically plasma etched using high-density plasma etching and an etchant gas mixture of $CF_4$, $CHF_3$, $O_2$, $N_2$, CO, $C_4F_8$, and Ar.

8. The method of claim 1, wherein said wet etch is a dilute solution of hydrofluoric acid and water having a ratio by volume of about 1:100.

9. The method of claim 1, wherein said third insulating layer is silicon oxide deposited by chemical vapor deposition and is planarized to a thickness of between about 6000 and 12000 Angstroms.

10. The method of claim 1, wherein said contact openings are anisotropically plasma etched using high-density plasma etching and an etchant gas mixture of $CF_4$, $CHF_3$, $O_2$, $N_2$, CO, $C_4F_8$, and Ar that achieves an etch-rate selectivity of said first insulating layer to said second insulating layer of greater than about 10:1.

11. A method for making FET gate electrodes having composite sidewall spacers using a trapezoidal-shaped insulating layer comprising the steps of:

providing a semiconductor substrate having device areas surrounded and electrically isolated by field oxide areas;

forming a gate oxide on said device areas;

depositing a polysilicon layer on said device areas and elsewhere on said substrate, said polysilicon layer being conductively doped;

patterning said polysilicon layer to form said FET gate electrodes on said device areas;

forming lightly doped source/drain areas adjacent to said FET gate electrodes;

depositing a first insulating layer composed of silicon oxide on said FET gate electrodes, said first insulating layer having a trapezoidal shape over said FET gate electrodes such that only the top edges of said FET gate electrodes are free of said first insulating layer;

depositing a conformal second insulating layer composed of silicon nitride on said first insulating layer;

anisotropically plasma etching said second insulating layer to said first insulating layer to form said sidewall spacers on sidewalls of said FET gate electrodes, said first insulating layer acting as an etch endpoint detect;

removing said first insulating layer remaining on said lightly doped source/drain areas using a hydrofluoric acid wet etch, while said second insulating layer protects said first insulating layer at top edges of said FET gate electrodes;

forming source/drain contact areas adjacent to said sidewalls of said FET gate electrodes in said device areas;

depositing a blanket third insulating layer on said substrate and planarizing;

etching contact openings in said third insulating layer to said source/drain contact areas, while said second insulating layer protects said first insulating layer at top edges of said FET gate electrodes when etching said contact openings that extend over said FET gate electrodes.

12. The method of claim 11, wherein said gate oxide is formed by thermal oxidation to a thickness of between about 40 and 100 Angstroms.

13. The method of claim 11, wherein said polysilicon layer is deposited to a thickness of between about 800 and 2000 Angstroms and is conductively doped to a concentration of between about 1.0 E 18 and 1.0 E 20 atoms/cm$^3$.

14. The method of claim 11, wherein said first insulating layer composed of silicon oxide is deposited by high-density-plasma chemical vapor deposition to a thickness of between about 100 and 500 Angstroms on horizontal surfaces of said substrate, while concurrently DC biasing said substrate during deposition to achieve a silicon oxide etch rate to silicon oxide deposition rate having a ratio equal to about 1 at said top edges of said FET gate electrodes.

15. The method of claim 11, wherein said first insulating layer composed of silicon oxide is conformally deposited by chemical vapor deposition and subsequently subjected to sputter etching in an inert gas to achieve a final thickness of between about 100 and 500 Angstroms on horizontal surfaces of said substrate, while said sputter etching results in enhanced etching at top edges of said FET gate electrodes thereby achieving said trapezoidal-shaped insulating layer.

16. The method of claim 11, wherein said second insulating layer composed of silicon nitride is deposited to a thickness of between about 300 and 3000 Angstroms.

17. The method of claim 11, wherein said silicon nitride is anisotropically plasma etched using high-density plasma etching and an etchant gas mixture of $CF_4$, $CHF_3$, $O_2$, $N_2$, CO, $C_4F_8$, and Ar.

18. The method of claim 11, wherein said hydrofluoric acid wet etch is a dilute solution of hydrofluoric acid and water having a ratio by volume of about 1:100.

19. The method of claim 11, wherein said third insulating layer is silicon oxide deposited by chemical vapor deposition and is planarized to a thickness of between about 6000 and 12000 Angstroms.

20. The method of claim 11, wherein said contact openings are anisotropically plasma etched using high-density plasma etching and an etchant gas mixture of $CF_4$, $CHF_3$, $O_2$, $N_2$, CO, $C_4F_8$, and Ar that achieves an etch-rate selectivity of silicon oxide to silicon nitride of greater than about 10:1.

* * * * *